(12) United States Patent
Goto et al.

(10) Patent No.: US 7,589,038 B2
(45) Date of Patent: Sep. 15, 2009

(54) INORGANIC COMPOSITION

(75) Inventors: Naoyuki Goto, Sagamihara (JP); Toshitaka Yagi, Sagamihara (JP); Takayuki Kishi, Sagamihara (JP)

(73) Assignee: Ohara Inc., Kanagawa (JP)

( * ) Notice: Subject to any disclaimer, the term of this patent is extended or adjusted under 35 U.S.C. 154(b) by 299 days.

(21) Appl. No.: 11/542,121

(22) Filed: Oct. 4, 2006

(65) Prior Publication Data

US 2007/0082294 A1 Apr. 12, 2007

(30) Foreign Application Priority Data

Oct. 7, 2005 (JP) ............................. 2005-295534
Jan. 27, 2006 (JP) ............................. 2006-018319

(51) Int. Cl.
*C03C 10/04* (2006.01)
*G11B 7/241* (2006.01)
*C03C 10/14* (2006.01)

(52) U.S. Cl. ............................. 501/5; 501/4; 428/846.9

(58) Field of Classification Search ..................... 501/4, 501/7, 5; 428/846.9
See application file for complete search history.

(56) References Cited

U.S. PATENT DOCUMENTS

| | | | |
|---|---|---|---|
| 3,804,608 A * | 4/1974 | Gaskell et al. | ............... 65/33.8 |
| 5,028,567 A | 7/1991 | Gotoh et al. | |
| 5,336,643 A | 8/1994 | Goto et al. | |
| 5,534,321 A | 7/1996 | Alpha et al. | |
| 5,580,363 A | 12/1996 | Goto et al. | |
| 5,804,520 A * | 9/1998 | Morinaga et al. | ............... 501/4 |
| 5,866,489 A | 2/1999 | Yamaguchi | |
| 5,868,953 A * | 2/1999 | Maekawa et al. | ............. 216/89 |
| 5,985,777 A | 11/1999 | Yamaguchi | |
| 6,120,922 A | 9/2000 | Goto | |
| 6,174,827 B1 | 1/2001 | Goto et al. | |
| 6,191,058 B1 | 2/2001 | Yamaguchi | |
| 6,284,340 B1 | 9/2001 | Abe et al. | |

(Continued)

FOREIGN PATENT DOCUMENTS

EP 0626 353 11/1994

(Continued)

OTHER PUBLICATIONS

European Search Report, for Application No. 06020965.7-2111, dated Jan. 25, 2007.

*Primary Examiner*—Karl E Group
(74) *Attorney, Agent, or Firm*—Squire, Sanders & Dempsey L.L.P.

(57) ABSTRACT

The present invention provides an inorganic composition for use in information recording medium disc substrate and such, having an excellent surface property capable of sufficiently corresponding with a ramp load system for high density recording, a high degree of tolerability to high speed rotation, and high productivity at a low melting point. Specifically, this invention provides an inorganic composition containing one crystalline phase selected from the group consisting of α-quartz (α-$SiO_2$), lithium disilicate ($Li_2Si_2O_5$) and lithium monosilicate ($Li_2SiO_3$), or that contain at least a crystalline phase of lithium monosilicate (Li2SiO3), in which a mean particle diameter of a particle showing a crystalline phase contained in the inorganic composition is 1 μm or less, a ring flexural strength is 300 MPa or more, and a surface roughness (an arithmetic mean roughness) thereof after a polishing process is 10 Å or less.

28 Claims, 1 Drawing Sheet

0.1 μm

U.S. PATENT DOCUMENTS

| | | |
|---|---|---|
| 6,287,663 B1 | 9/2001 | Goto |
| 6,327,874 B1 | 12/2001 | Goto |
| 6,379,775 B1 | 4/2002 | Kobayashi |
| 6,383,645 B1 | 5/2002 | Goto et al. |
| 6,395,368 B1 | 5/2002 | Yamaguchi et al. |
| 6,413,890 B1 | 7/2002 | Goto |
| 6,420,286 B1 | 7/2002 | Goto et al. |
| 6,582,826 B1 | 6/2003 | Goto et al. |
| 6,593,257 B1 | 7/2003 | Nagata et al. |
| 6,794,043 B2 | 9/2004 | Goto et al. |
| 7,452,836 B2 * | 11/2008 | Apel et al. .............. 501/5 |
| 2003/0012961 A1 | 1/2003 | Goto et al. |
| 2005/0098064 A1* | 5/2005 | Schweiger et al. ........... 106/35 |
| 2008/0120994 A1* | 5/2008 | Schweiger et al. .......... 65/33.4 |
| 2008/0125303 A1* | 5/2008 | Schweiger et al. ............. 501/4 |
| 2008/0299501 A1* | 12/2008 | Borrelli et al. .............. 430/323 |

FOREIGN PATENT DOCUMENTS

| | | | |
|---|---|---|---|
| EP | 0625778 | | 11/1994 |
| JP | 61063542 | * | 4/1986 |
| JP | 62-072547 | | 4/1987 |
| JP | 6-329440 | | 11/1994 |
| JP | 7-169048 | | 4/1995 |
| JP | 7-157331 | | 6/1995 |
| JP | 08-221747 | | 8/1996 |
| JP | 09-035234 | | 2/1997 |
| JP | 09-208260 | | 8/1997 |
| JP | 10-45426 | | 2/1998 |
| JP | 11-16143 | | 1/1999 |
| JP | 11-199274 | | 7/1999 |
| JP | 2000-11904 | | 4/2000 |
| JP | 2000-233941 | | 8/2000 |
| JP | 2000-302481 | | 10/2000 |
| JP | 2001-019489 | | 1/2001 |
| JP | 2001-019490 | | 1/2001 |
| JP | 2001-184624 | | 7/2001 |

* cited by examiner 0.1 μm 0.1 μm

INORGANIC COMPOSITION

This application is based on and claims the benefit of priority from Japanese Patent Application No. 2005-295534, filed on 7th Oct. 2005, and Japanese Patent Application No. 2006-018319, filed on 27th Jan. 2006, the content of which is incorporated herein by reference.

BACKGROUND OF THE INVENTION

1. Field of the Invention

The present invention relates to an inorganic composition containing particles of a minute particle diameter and having a good mechanical strength and an excellent surface roughness which is little altered after a surface treatment with acid or alkali, and furthermore having a thermal expansion property well suitable with other materials. Especially, this invention relates to a substrate for a magnetic recording medium used in various magnetic information recording devices, in particular, to a disc-shaped substrate for information recording medium having a surface ultra-smoothness, a washing property and a high strength in a perpendicular magnetic recording medium. In the present invention, the term "information recording medium" denotes a magnetic information recording medium usable in a built-in hard disc, a removal hard disc, and a card-type hard disc used as a hard disc of personal computer; a hard disc for a digital video camera and a digital camera and an audio equipment; a hard disc for automobile navigation, and a hard disc for mobile phone.

2. Background Art

Recently, a large volume of data such as animation and sound have become handled with a multimedia personal computer, a digital video camera and a digital camera so that a magnetic information recording apparatus with a high-capacity has become necessary. As a result, in order to increase the areal density of a magnetic information recording medium, there is a tendency to increase the bit and track densities thereof while reducing the bit cell size. For corresponding with this tendency, along with the reduction of the bit cell size, a magnetic head becomes to operate in a state closer to a disc surface. Thus, when a magnetic head operates in a low floating state to a magnetic information recording medium disc substrate or in a state in contact therewith, it becomes important to develop, as a technique for starting and stopping a magnetic head, a technique such as a landing zone method in which an adhesion preventive treatment (a texture processing and so on) is performed at a specific portion of a magnetic information recording medium disc substrate (a non-recording portion on the inside or outside diameter side of a disc) to perform the starting and stopping of the magnetic head at that portion.

In the currently used magnetic information recording device, the CSS (contact-start-stop) method is used in which the operation is repeated such that a magnetic head is in contact with a magnetic information recording medium disc substrate prior to starting the device, and floats from the substrate when the device is started. In this case, when the both contact-making surfaces are more than necessary smooth like a mirror, the stiction occurs between them so as to cause problems such as a non-smooth rotation starting and a damage of the magnetic information recording medium surface along with the increase in the friction index. Thus, for the magnetic information recording medium disc substrate, the contradicting requirements are demanded, that is, a low-floating of the magnetic head along with the increase in the recording capacity and a prevention of stiction of the magnetic head on the magnetic information recording medium disc substrate. For these contradicting requirements, a landing zone technique has been developed to provide a starting/stopping portion for the magnetic head in a specific region on the magnetic information recording medium disc substrate.

Furthermore, when the recording density exceeds 100 $Gb/in^2$, the substrate becomes thermo-unstable (heat fluctuation) with such a minute magnetization unit, so that the longitudinal recording system reaches a physical limit for the demand for a high density recording exceeding 100 $Gb/in^2$.

For solving these problems, a perpendicular magnetic recording system has been adopted, which makes the easy magnetization axis perpendicular so as to be capable of reducing the bit size in the extreme and also expecting the reduction of the anti-magnetic field as well as the effect by the shape magnetic anisotropy owing to having a predetermined medium film thickness (from 5 to 10-fold of the longitudinal recording system), enabling the solution of problems such as the decrease in the recording energy and heat fluctuation of the substrate occurring in the high density of the conventional longitudinal magnetic recording system and the realization of superior improvement of the recording density compared to the conventional longitudinal magnetic recording system. As a result, in the perpendicular magnetic recording system, it has already become possible to practically achieve the recording density of 100 $Gb/in^2$ or more at the mass production level, and researches on the recording density exceeding 300 $Gb/in^2$ have been already under way.

In this perpendicular magnetic recording system, magnetization is performed perpendicularly to the medium surface, such that a medium having the easy magnetization axis in the perpendicular direction is used different from a conventional medium having the easy magnetization axis in the longitudinal direction. As a recording layer of the perpendicular magnetic recording system, chromium alloys, such as CoCrPt, CoCrPt—Si, and CoCrPt—$SiO_2$; and iron alloy such as FePt have been researched and put to practical use.

However, for such a medium of a metallic oxide type including FePt and the like, it is necessary to raise the film formation temperature for the miniaturization of the magnetic body crystalline particles and perpendicular formation thereof. Furthermore, in a certain recent study, annealing is performed some times at high temperatures (in the range from 300 to 900° C.) to improve the magnetic property. Therefore, a substrate material must be sustainable such a high temperature, and must not generate a deformation of the substrate and a deterioration of the surface roughness thereof.

In addition, along with the magnetic recording density improvement, the perpendicular magnetic recording medium also tends towards a low-floating type with the head-floating height of 15 nm or less, and, furthermore, a near-contact recording type or a contact-recording type. On the other hand, in order to efficiently use the medium surface as a data region, the medium system has become a ramp-loading system from the system provided with the conventional landing region. Accordingly, the data region of a disc surface or the entire surface of a substrate surface must be ultra-smooth and flat so as to enable the reduction in this floating height and the contact recording.

Furthermore, these magnetic recording medium substrates must have none of crystal anisotropy, foreign substance, impurity, and such to affect the film-forming medium crystals, have precise, homogeneous and minute structure, and a chemical tolerance against washing and etching with various drugs.

And, these days, for speeding up information processing, technical development has been in progress by rotating the magnetic information recording medium disc substrate of a magnetic recording device at high speed. However, rotation at high speed may cause a deflection and deformation of the substrate, such that a high mechanical strength is required for the substrate material. In addition, for the current built-in magnetic information recording device, a magnetic information recording device with a removable disc system and a card disc system is on the stage of investigation and practical use, the application development to digital video camera, digital camera, and so one being started.

Although, traditionally, as a magnetic disc substrate material, aluminum alloy has been used a great correspond, substrate made of aluminum alloy is apt to produce projections or spot-like unevenness on the substrate surface in the polishing process, so that a satisfactory substrate in terms of flatness and smoothness is hardly obtainable. And, aluminum alloy is a soft material and easily deformed so as to hardly correspond with a tendency of ultra-slim substrate. Furthermore, aluminum alloy has problems such as causing head crash due to deflection during a high-speed rotation resulting in the medium damage so as not to be a material sufficiently corresponding with the high density recording in the future. Furthermore, since its allowable temperature limit during the film formation, the most important feature in a magnetic recording system, is 300° C. or less, the substrate becomes thermally deformed when the film formation is performed at 300° C. or more, or when annealing is conducted at high temperatures such as from 500 to 900° C. Therefore, aluminum alloy is hardly applicable to a substrate used in the magnetic recording medium requiring such a high temperature processing.

As a material to solve problems involved in the aluminum alloy substrate, the chemically reinforced soda lime glass ($SiO_2$—CaO—$Na_2O$) and aluminosilicate glass ($SiO_2$—$Al_2O_3$—$Na_2O$) have been known.

In these cases, since polishing is performed after the chemical reinforcement treatment, the number of insecure elements in the reinforced layer is high in the slim disc formation, and also the heat resistance of the substrate itself is low. That is, after the film formation on a given sample by heating the magnetic recording medium at 300° C. or more, flatness measured by a predetermined method becomes ruined. As a result, there cause problems such as a deformation after the medium film formation, an elution of alkaline component from the inside of the substrate to cause the film damage, and a deterioration of the reinforced layer and non-reinforced layer.

And as a material to overcome shortcomings of the above-described chemically reinforced glass substrate, there have been developed various glass ceramics, such as a crystallized glass of an $SiO_2$—$Li_2O$—$P_2O_5$ type containing lithium disilicate crystals ($Li_2Si_2O_5$) and α-quartz (α-$SiO_2$) crystals; and a crystallized glass of an $SiO_2$—$Al_2O_3$—$Li_2O$ type containing lithium disilicate crystals ($Li_2Si_2O_5$) and β-spodumene ($LiAlSi_2O_6$) crystals (for example, Patent documents 1 to 11, etc.).

Patent Document 1: Japanese Unexamined Patent Application, Publication No. Sho 62-72547,
Patent Document 2: Japanese Unexamined Patent Application, Publication No. Hei 06-329440,
Patent Document 3: Japanese Unexamined Patent Application, Publication No. Hei 07-169048,
Patent Document 4: Japanese Unexamined Patent Application, Publication No. Hei 09-35234,
Patent Document 5: U.S. Pat. No. 5,336,643,
Patent Document 6: U.S. Pat. No. 5,028,567,
Patent Document 7: Japanese Unexamined Patent Application, Publication No. Hei 10-45426,
Patent Document 8: Japanese Unexamined Patent Application, Publication No. Hei 11-16143,
Patent Document 9: Japanese Unexamined Patent Application, Publication No. 2000-233941,
Patent Document 10: Japanese Unexamined Patent Application, Publication No. 2000-302481, and
Patent Document 11: Japanese Unexamined Patent Application, Publication No. 2001-184624.

However, a crystallized glass of a $Li_2O$—$Al_2O_3$—$SiO_2$ type according to Patent Document 1 has lithium disilicate ($Li_2Si_2O_5$) and α-cristobalite as a crystalline phase, advantageously controls the thermal expansion coefficient thereof by separating the above-described crystalline phase, and is able to obtain a magnetic disc substrate with a high strength. However, it cannot sufficiently correspond with a tendency of low-floating head along with the recording capacity improvement in a great and rapid progress for the targeted surface roughness (Ra).

A crystallized glass of an $SiO_2$—$Li_2O$—MgO—$P_2O_5$ type according to Patent Document 2 has lithium disilicate ($Li_2Si_2O_5$) and α-quartz (α-$SiO_2$) as a crystalline phase, and does not need the conventional mechanical texture and chemical texture by controlling the spherical particle size of α-quartz (α-$SiO_2$) thereby making it possible to control the surface roughness (Ra) after polishing in the range from 15 to 50 Å so as to be a very excellent material as an entire surface texture material of the substrate surface. However, the targeted surface roughness (Ra) thereof is too large compared to 10 Å or less such that it cannot sufficiently correspond with a tendency of low-floating head along with the recording capacity improvement in a great and rapid progress. Furthermore, it has a low thermal resistance similarly as the reinforced glass so as to pose problems such as the substrate deformation after the medium film formation and annealing as well as alteration of the surface roughness.

Although in Patent Document 3 is disclosed a photosensitive crystallized glass of an $SiO_2$—$Li_2O$ type containing photosensitive metals such as Au and Ag, and in Patent Document 4 is disclosed a substrate for use in the magnetic disc comprising lithium disilicate ($Li_2Si_2O_5$) and β-spodumene ($LiAlSi_2O_6$) in a glass of a $SiO_2$—$Al_2O_3$—$Li_2O$ type respectively, both of these glass ceramics substrate materials have a low heat resistance, posing problems, such as deformation of the substrate after the film formation and annealing as well as alteration of the surface roughness.

And, in Patent Document 4 is described a substrate for use in the magnetic disc with a principal crystalline phase comprising lithium disilicate ($Li_2Si_2O_5$) and β-spodumene ($LiAlSi_2O_6$) in a glass of a $SiO_2$—$Al_2O_3$—$Li_2O$ type, in which β-eucryptite ($Li_2Al_2Si_2O_8$) has been separated by newly performing the above-described crystallization heat treatment at lower temperatures (from 680 to 770° C.). However, although these crystallized glass substrates elute less alkali compared with chemically reinforced amorphous glass, the alkali elution still occurs, and even these crystallized glass substrates are posing problems such as a "decrease in the magnetic property of the recording medium," an "adhesion of defect to the substrate surface," and a "record missing" caused by the alkali elution.

And, although in Patent Document 5 is disclosed a low expansion transparent crystallized glass of a $SiO_2$—$Al_2O_3$—$Li_2O$ type, and in Patent Document 6 is disclosed a crystallized glass of a $SiO_2$—$Al_2O_3$—ZnO type, respectively, both of these glass ceramics materials were not examined and suggested as a substrate material for use in a perpendicular magnetic recording medium for the heat resistance (that is, the degree of flatness measured by a predetermined method after the exposure to a specified temperature environment (at 500° C. or more for 5 minutes or more) at all. The particularly important maintenance of ultra-flatness of the substrate surface after the film formation and annealing at high temperature was not discussed at all.

In Patent Documents 7 and 8 is disclosed a technique of preparing a crystallized glass for a laser texture by separating, from a crystallized glass of an $SiO_2$—$Li_2O$—$K_2O$—$P_2O_5$—$Al_2O_3$ type, lithium disilicate ($Li_2Si_2O_5$), mixed crystals of lithium disilicate and α-quartz (α-$SiO_2$), or mixed crystals of lithium disilicate and α-cristobalite (α-$SiO_2$), or mixed crystals of lithium disilicate, α-cristobalite and α-quartz (α-$SiO_2$) as a crystalline phase. And in Patent Document 10 is disclosed a similar technique of preparing a crystallized glass for a laser texture by separating, from a crystallized glass of an $SiO_2$—$Li_2O$—$P_2O_5$—$Al_2O_3$ type, the above-described lithium disilicate and those mixed crystals. However, the targeted surface roughness Ra (an arithmetic mean roughness) these days is 10 Å or less, preferably 5.0 Å or less, more preferably 3.0 Å or less, and most preferably 2.0 Å or less, so that these glass ceramics cannot sufficiently correspond with the tendency of a low floating head along with the recording capacity improvement making rapid progress.

In Patent Document 9 is disclosed a technique of preparing a crystallized glass substrate for high recording density by separating, in a crystallized glass of an $SiO_2$—$Li_2O$—$K_2O$—$P_2O_5$—$ZrO_2$—$Al_2O_3$ type, lithium disilicate ($Li_2Si_2O_5$), mixed crystals of lithium disilicate and α-quartz (α-$SiO_2$), mixed crystals of lithium disilicate and α-cristobalite (α-$SiO_2$), or mixed crystals of lithium disilicate, α-cristobalite, and α-quartz; while in Patent Document 11 is disclosed a similar technique of preparing a crystallized glass substrate for high recording density (characterized) by separating, in a crystallized glass of an $SiO_2$—$Li_2O$—$K_2O$—$P_2O_5$—$ZrO_2$—$Al_2O_3$—$Na_2O$ type, mixed crystals of lithium disilicate and α-quartz (α-$SiO_2$), and mixed crystals of lithium disilicate and β-spodumene ($Li_2Al_2Si_4O_{12}$). Although the crystallized glass manufactured by this technique can secure a flatness and smoothness on atomic level by polishing processing, it poses problems in surface property such as a significant alteration of smoothness and a formation of minute projections as the effect of various washings performed in the process of magnetic film formation.

Since these glass ceramics are different in hardness between the crystalline phase and amorphous phase, minute concaves and convexes are irreversibly generated between these two phases after the polishing processing, thereby these concaves and convexes having been playing a role in preventing a magnetic head from adhering to a disc substrate.

On the other hand, in a magnetic information recording device, in response to the aforementioned landing zone technique, a ramp load technique (contact recording with a magnetic head) has been developed in which a portion for start/stop of the head is removed from the magnetic information recording medium disc substrate so that concaves and convexes preventing the magnetic head from adhering to the disc substrate has become unnecessary. Therefore, it has become possible that the magnetic head operates in a state extremely close to the information recording medium surface by making the substrate surface ultra-flat and smooth, and that the bit cell size is reduced and the recording density is increased.

Accordingly, in order to prevent a head and medium from damage even at such an extremely low floating height or in a state in which a head is in contact with a medium, the surface roughness Ra (an arithmetic mean roughness) of a substrate is preferably made to be not more than 10 Å. However, to obtain such an ultra-fine and smooth polished surface, a substrate comprising crystals having minute mean crystalline particle diameter is demanded.

Also, along with an increase in the recording density, a high precision is required in positioning a magnetic head and a medium, so that a high dimensional accuracy is required for each component of the disc substrate and magnetic information recording device. Consequently, since the effect of differences in the mean thermal expansion coefficients on these components becomes not negligible, differences in these mean thermal expansion coefficients must be made as little as possible. More strictly, it is often preferable that a mean coefficient of thermal expansion of a disc substrate is very slightly larger than a mean coefficient of linear expansion of these components.

As a component used in a small-sized magnetic information recording medium in particular, the one having the thermal expansion coefficient from +90 to +100 ($\times 10^{-7}$·° $C.^{-1}$) is often used, and it is thought it necessary that the disc substrate also has a thermal expansion coefficient in this range, causing trouble of the generation of writing error even with a confusion of thermal expansion coefficient as small as 1 ($\times 10^{-7}$·° $C.^{-1}$). However, the range of thermal expansion coefficient has become wider by a design in the drive so as to have a certain degree of freedom therein so that a component with a low thermal expansion coefficient has become usable in the drive design. That is, even a composition having the thermal expansion coefficient in the range from +60 to +80 ($\times 10^{-7}$·° $C.^{-1}$) has become usable in the component.

An objective of the present invention is to provide an inorganic composition used in an information recording medium and such which has an excellent surface property capable of sufficiently corresponding with a ramp load system for a high density recording in both of the longitudinal magnetic recording system and perpendicular magnetic recording system in response to the above-described design improvement of magnetic information recording devices; a high strength durable to high speed rotation; both of the heat expansion property and heat resistance suitable with each drive element; a low melting point; and a high productivity.

SUMMARY OF THE INVENTION

In order to achieve the above-described objective, the present inventors have performed extensive research, and as a result, have found that a composition containing at least one crystalline phase selected from lithium monosilicate ($Li_2SiO_3$), lithium disilicate ($Li_2Si_2O_5$), and α-quartz (α-$SiO_2$), or that contain at least a crystalline phase of lithium monosilicate ($Li_2SiO_3$), is much superior to inorganic compositions such as glass ceramics used in conventional information recording media in that the composition has an excellent surface with extreme smoothness after polishing; a high degree of tolerability towards high speed rotation of information recording device, and furthermore, a heat expansion property suitable with the drive components, achieving the present invention. In particular, a disc substrate and such for the information recording medium using an inorganic composition such as crystallized glass to achieve an objective of the present invention are preferably used in the ramp load system because of its surface smoothness. More specifically, the present invention provides the following.

A first aspect of the present invention is an inorganic composition containing at least one crystalline phase selected from the group consisting of α-quartz ($SiO_2$), lithium disilicate ($Li_2Si_2O_5$), and lithium monosilicate ($Li_2SiO_3$)

Most of inorganic compositions containing at least one crystalline phase selected from α-quartz ($SiO_2$), lithium disilicate ($Li_2Si_2O_5$), and lithium monosilicate ($Li_2SiO_3$), especially most glass ceramics of a $SiO_2$—$LiO_2$ type not only increase the degree of crystallinity as the crystallization temperature becomes higher but also transfer crystals to a $SiO_2$-rich phase. When heating (rising the temperature of) the above-described inorganic composition, a phase separation occurs within the inorganic composition to generate crystal nuclei in the phase separation interface followed by a formation of $Li_2SiO_3$ (lithium monosilicate), $Li_2Si_2O_5$ (lithium disilicate), and, depending on the situation, α-quartz ($SiO_2$) derived therefrom, which is rearranged to a compound of β-quartz type by a solid solution of Al ion, etc.

Since these crystalline phases are separated at relatively low temperatures, minute crystalline particles are separated, and a composition having excellent surface property and physical properties is easily obtained. In this case, in a relatively low temperature range of the crystallization temperature range in which crystalline phases of the above-described lithium monosilicate ($Li_2SiO_3$) and lithium disilicate ($Li_2Si_2O_5$) coexist, the crystalline particle diameter is extremely minute, so that a much superior surface roughness and ring flexural strength can be obtained. Also, since the separation of α-quartz (α-$SiO_2$) with a large particle diameter is limited to a low level, the surface smoothness is superior. However, an ultra-smooth surface increases the stiction (adsorption) power between a head and medium, causing damage to a medium. Therefore, when moderate smoothness is required instead of an ultra-smooth surface, a desired smooth surface causing no medium damage can be obtained by appropriately separating α-quartz (α-$SiO_2$).

Also, among compounds of the same type in general, though this may be slightly altered depending on the temperature range, the relationship of $Li_2SiO_3 < Li_2Si_2O_5 < \alpha\text{-}SiO_2$ is established regarding the thermal expansion coefficients. The thermal expansion coefficient of α-$SiO_2$ exceeds +200 ($\times 10^{-7 \cdot \circ} C.^{-1}$) in a high temperature range. Since the thermal expansion coefficient of the original glass of this type is in the range from +60 to +100 ($\times 10^{-7 \cdot \circ} C.^{-1}$), when α-$SiO_2$ and such with a large difference in thermal expansion coefficient are separated, the deformation between crystals and original glass is apt to become large and affect the strength of that composition. Thus, $Li_2SiO_3$ has a merit in having a smaller difference in the thermal expansion coefficient relative to the original glass than α-$SiO_2$.

Furthermore, it has been known that the relationship of $Li_2SiO_3$<original glass<$Li_2Si_2O_5$<α-$SiO_2$ in general is established regarding the acid resistance between the original glass and the aforementioned crystals. After a polishing with $CeO_2$ (cerium oxide) and such, in order to wash the remaining abrasive adsorbed to the surface, a surface washing by hydrofluoric acid immersion is performed. As a result, when the difference in the acid resistance between the original glass and crystals, and the difference in the elution rate between them in particular are large, the surface roughness is deteriorated after the surface purification. $Li_2SiO_3$ is inferior to the original glass in acid resistance, and also different from it in the elution rate to hydrofluoric acid. However, since $Li_2SiO_3$ crystal grows from such a relatively low temperature as 600° C. and has an extremely minute crystalline particle diameter, and much superior surface roughness of the substrate can be obtained in spite of a difference in the elution rate toward hydrofluoric acid. On the other hand, $Li_2Si_2O_5$ and α-$SiO_2$ are strongly acid-resistant, and also relatively slow in the elution rate toward hydrofluoric acid, so as to enable to obtain an excellent surface roughness. In this case, it is preferable that the principal crystalline phase of the glass ceramics of the present invention does not contain crystals having a negative thermal expansion property, such as β-spodumene, β-eucryptite, and β-cristobalite (β-$SiO_2$), besides them, diopside, enstatite, mica, α-tridymite, fluorrichiterite, and such as much as possible.

Herein, the term "glass ceramics" denotes a polycrystal comprising polycrystalline substance crystallized by re-heating an original glass with a specific composition and a glassy (hyaline) material.

A second aspect of this invention is an inorganic composition containing a crystalline phase of lithium monosilicate ($Li_2SiO_3$).

Most of glass ceramics of a $SiO_2$—$LiO_2$ type not only increase the crystallinity degree as the crystallization temperature becomes higher but also transfer crystals to a $SiO_2$-rich phase. When heating (rising the temperature of) the above-described glass for crystallization thereof, a phase separation occurs within the glass to generate crystal nuclei in the phase separation interface followed by a formation of $Li_2SiO_3$, $Li_2Si_2O_5$, and, depending on the situation, α-$SiO_2$ derived therefrom, which are transformed to a compound of β-quartz type by solid solution of Al ions, etc. Among the compounds of the same type in general, though may be slightly altered depending on the temperature range, the relationship of $Li_2SiO_3 < Li_2Si_2O_5 < \alpha\text{-}SiO_2$ is established regarding the thermal expansion coefficients. The thermal expansion coefficient of α-$SiO_2$ exceeds +200 ($\times 10^{-7 \cdot \circ} C.^{-1}$) in the high temperature range. Since the thermal expansion coefficient of the original glass of this type is in the range from +60 to +100 ($\times 10^{-7 \cdot \circ} C.^{-1}$), when α-$SiO_2$ and such with a large difference in the thermal expansion coefficient are separated, the deformation between crystals and original glass is apt to become large and affect the strength of that composition. Thus, $Li_2SiO_3$ has a merit in having a smaller difference in the thermal expansion coefficient relative to the original glass than α-$SiO_2$.

Furthermore, it has been known that the relationship of $Li_2SiO_3$<original glass<$Li_2Si_2O_5$<α-$SiO_2$ in general is established regarding the acid resistance among the original glass and the aforementioned crystals. After the polishing with $CeO_2$ (cerium oxide) and such, in order to wash the remaining abrasive adsorbed to the surface, a surface washing by a hydrofluoric acid immersion is performed. As a result, when the difference in the acid resistance among the original glass and crystals, and the difference in the elution rate among them in particular are large, the surface roughness is deteriorated after the surface purification. Although $Li_2SiO_3$ is inferior to the original glass in terms of the acid resistance, and also different from it in terms of elution rate to hydrofluoric acid, $Li_2SiO_3$ crystal grows from such a relatively low temperature as 600° C. and has an extremely minute crystalline particle diameter, such that a superior surface roughness of the substrate can be obtained than with the separation of $Li_2Si_2O_5$ and α-$SiO_2$ without any significant effect on the elution rate toward hydrofluoric acid.

A third aspect of this invention is the inorganic composition according to the above-described second aspect further containing at least one kind of the crystalline phase selected from lithium disilicate ($Li_2Si_2O_5$) and α-quartz ($SiO_2$).

According to the inorganic composition of the present invention, the crystalline particle diameter is minute, and as a result the surface subjected to polishing is extremely smooth, having a high ring flexural strength. That is, lithium disilicate ($Li_2Si_2O_5$) starts to crystallize at the temperature of 700° C., enabling the production of crystallized glass at a lower temperature than the conventional glass ceramics. Furthermore, lithium disilicate ($Li_2Si_2O_5$) has characteristics equivalent to those of lithium monosilicate ($Li_2SiO_3$) including the minute particle diameter of separated crystals and the thermal expansion coefficient close to that of the original glass so as to enable the acquisition of an ultra-smooth polished surface. However, since an ultra-smooth surface increases the stiction power between a head and medium to cause damage to medium, a moderate smoothness becomes necessary instead of an ultra-smooth surface. Then, a desired smooth surface causing no damage to a medium can be obtained by appropriately separating α-quartz (α-$SiO_2$) with a large particle diameter.

A fourth aspect of the invention is the inorganic composition according to the above-described first or second aspects in which the mean particle diameter of a particle showing the aforementioned crystalline phase is 1 μm or less.

A fifth aspect of the invention is the inorganic composition according to any one of the above-described first to third aspects in which a mean particle diameter of a particle showing the aforementioned crystalline phase is 100 nm or less.

A sixth aspect of the invention is the inorganic composition according to the above-described first or second aspects in which a mean particle diameter of a particle showing the aforementioned crystalline phase is 50 nm or less.

A seventh aspect of the invention is the inorganic composition according to the above-described first or second aspects in which a mean particle diameter of a particle showing the aforementioned crystalline phase is 1 nm or more and 50 nm or less.

According to the fourth to seventh aspects of the invention, since the mean particle diameter of a particle showing a crystalline phase is 1 μm or less, preferably 100 nm or less, more preferably 50 nm or less, and most preferably 1 nm or more and 50 nm or less, an ultra-smooth polished surface can be obtained. Therefore, when such a composition is used as a substrate, such as a disc substrate for information recording medium, the surface roughness Ra (arithmetic mean roughness) of the substrate can be adjusted to 10 Å or less, preferably 5 Å or less, more preferably 3 Å or less, and most preferably 2 Å or less, such that even though the distance between a magnetic head and substrate is small, and no collision of the projections of a substrate with a magnetic head occurs to cause the damage of magnetic head and that of substrate. Therefore, the recording density can be increased. Also a uniform separation of such minute crystals improves a mechanical strength of the inorganic composition, such that the ring flexural strength is, at the minimum, 300 MPa or more, preferably 450 MPa or more, more preferably 500 MPa, and most preferably 750 MPa or more, and at the maximum, preferably 1600 MPa or less. Thus, for example, when the composition is used as a substrate such as a disc substrate for magnetic recording medium, the surface recording density can be enlarged, and even though the substrate itself is rotated at high speed to improve the recording density, neither deflection nor deformation is generated, such that vibration due to this rotation is decreased, resulting in the reduction of the data-reading error number (TMR) caused by the vibration and deflection. Herein, particles showing a crystalline phase are to be those constituting a crystalline phase and containing particles of crystalline substance and those of amorphous substance.

Herein, the term "mean particle diameter of the above-described particles showing a crystalline phase" denotes a particle diameter in terms of the central cumulative value ("median diameter" d50) of the area standard of the particle diameter measured with a transmission electron microscope (TEM) image. And, the term "ring flexural strength" denotes a flexural strength measured by preparing a thin disc-shaped sample of about 65 mm in diameter and about 0.6 mm in thickness, and measuring the longitudinal strength of the disc-shaped sample using a circular supporting ring and a loading ring by a concentric circle flexural method.

An eighth aspect of the invention is the inorganic composition according to the above-described first or second aspects in which a particle content showing the aforementioned crystalline phase is from 1 to 44% by mass.

According to the eighth embodiment, when the inorganic composition is shaped into a substrate such as a disc substrate for an information-recording medium, a reduction in the surface roughness (Ra) and an excellent mechanical property of the substrate after the polishing are realized. In this case, as a quantitative handling of the crystal amount, the content thereof was assessed by finding the diffraction peak area from an X-ray diffraction pattern obtained with an X-ray diffractometer (Phillips, brand name: X' pert-MPD) and referring it to a calibration curve.

A ninth aspect of the invention is the inorganic composition according to the above-described first or second aspects in which a ring flexural strength is 300 MPa or more.

A tenth aspect of the invention is the inorganic composition according to the above-described first or second aspects in which a ring flexural strength is 450 MPa or more.

An eleventh aspect of the invention is the inorganic composition according to the above-described first or second aspects in which a ring flexural strength is 750 MPa or more and 1600 MPa or less.

Since, according to the above-described ninth to eleventh aspects of the present invention, since a flexural strength of the inorganic composition is high, when this composition is used as a substrate such as a disc substrate for information recording medium, the generation of deflection and deformation due to a high-speed rotation of the substrate itself is suppressed so that a distance between a magnetic head and substrate can be reduced. Thus, an areal density can be increased, and furthermore, vibration due to the rotation is decreased, resulting in a reduction of data-reading error number (TMR) caused by the vibration and deflection.

A twelfth aspect of the invention is the inorganic composition according to the above-described first or second aspects in which a surface roughness (Ra) is 10 Å or less.

According to this embodiment, since the surface is extremely flat and smooth, when this composition is used as a substrate such as a disc substrate for information recording medium, a distance between a magnetic head and substrate can be reduced. As a result, an areal density of data writing and such can be increased.

A thirteenth aspect of the invention is the inorganic composition according to the aforementioned first or second aspects in which, when a surface roughness (Ra) after polishing is termed Ra1, and that by acid washing or alkali washing after the polishing is termed Ra2, a value of the rate of change in surface roughness (|Ra2−Ra1|/Ra1) is less than 0.62.

A fourteenth aspect of the invention is the inorganic composition according to the aforementioned first or second aspects in which, a surface roughness (Ra) after polishing is 0.5 Å or more and 10 Å or less, and an amount of changes in surface roughness by acid washing and alkali washing after the polishing is less than 2.0 Å.

A fifteenth aspect of the invention is the inorganic composition according to the aforementioned first or second aspects in which, a surface roughness (Ra) after the polishing is 0.5 Å or more and 10 Å or less, and an amount of change in surface roughness due to hydrofluoric acid washing after the polishing is less than 2.0 Å.

According to the thirteenth, fourteenth and fifteenth embodiments of the invention, even though an inorganic composition, especially, a substrate such as a disc substrate for information recording medium comprising the crystallized glass, is subjected to a washing with acid and alkali or hydrofluoric acid after polishing of the substrate to remove glass rubbish and abrasive adhering to the substrate surface, even though, in particular, a glass ceramics in which crystals and a glassy substance coexist in the glass matrix is subjected to the washing, the surface roughness is not deteriorated because of a difference in etching grade between the crystal and glassy substance by the washing treatment with acid and alkali, such that the surface roughness (Ra) is not damaged.

Herein, the term "amount of change in surface roughness" denotes an amount of change in surface roughness, relative to the surface roughness of a substrate after the polishing, of the substrate after the above-described washing treatment following the polishing, and is expressed as "amount of change in surface roughness=surface roughness after washing treatment—surface roughness of a substrate after polishing." And a ratio of change in surface roughness is a ratio of surface roughness to an amount of change in surface roughness of a substrate after the polishing, and expressed by a ratio of change in surface roughness=amount of change in surface roughness/surface roughness of a substrate after polishing.

A sixteenth aspect of the invention is the inorganic composition according to the above-described first or second aspects in which, the aforementioned inorganic composition contains the following components as the formed oxides in terms of % by mass:

$SiO_2$: from 50 to 90% by mass; $Li_2O$: from 5 to 15%; $Al_2O_3$: from 0 to 20%; MgO: from 0 to 3%; ZnO: from 0 to 3%; $P_2O_5$: from 0 to 3%; $ZrO_2$: from 0 to 3%; $K_2O$: from 0 to 2%; and $Sb_2O_3+As_2O_3$: from 0 to 2% by mass.

A seventeenth aspect of the invention is the inorganic composition according to the above-described sixteenth aspect in which the mass ratio of $Li_2O/K_2O$ is 5.5 or more in the aforementioned component.

A eighteenth aspect of the invention is the inorganic composition according to any one of the above-described first to fifteenth aspects in which, the aforementioned inorganic composition contains the following components as the formed oxides in terms of % by mass:

$SiO_2$: from 70 to 82% by mass; $Li_2O$: from 7 to 13%; $Al_2O_3$: from 3 to 10%; MgO: from 0 to 3%; ZnO: from 0 to 3%; $P_2O_5$: from 1 to 3%; $ZrO_2$: from 0 to 3%; $K_2O$: from 0 to 2%; and $Sb_2O_3+As_2O_3$: from 0 to 2% by mass.

According to the sixteenth and eighteenth embodiment of the invention, crystalline layers of lithium monosilicate and lithium disilicate are apt to be selectively formed. In this case, in the inorganic composition according to the present invention, especially in the crystallized glass, the $SiO_2$ component, $Li_2O$ component, and $Al_2O_3$ component play an important role. That is, the $SiO_2$ component and $LiO_2$ component are extremely important components in separating lithium disilicate, lithium monosilicate, and α-quartz as a crystalline phase by heat treatment of a composition obtained by melting, shaping and annealing the above-described composition (hereinafter referred to as an original inorganic composition); and the $SiO_2$ component is contained, at the minimum, in an amount of preferably 50% or more, more preferably 70% or more; and at the maximum, in an amount of preferably 90% or less, and more preferably 82% or less. And, the $LiO_2$ component is contained, at the minimum, in an amount of preferably 5% or more, more preferably 7% or more, and at the maximum, in an amount of preferably 15% or less, and even more preferably 13% or less.

And, the $Al_2O_3$ component is effective in improving chemical durability, mechanical strength, and hardness of the inorganic composition in particular, and can be optionally added. However, in order to efficiently achieve the above-described effects, the $Al_2O_3$ component is contained, at the minimum, in an amount of preferably 0% or more, more preferably 3% or more, and at the maximum, in an amount of 20% or less, and even more preferably 10% or less.

Herein, the term "amount of the formed oxide in terms of % by mass" denotes an amount of each component contained as the formed oxide in the inorganic composition assuming that oxides, nitrates, and such used as the raw material of components of the inorganic composition of the present invention are all decomposed and converted into oxides at the time of melting, which is expressed in terms of % by mass relative to the total mass of the produced oxides taken as 100% by mass.

A nineteenth aspect of the invention is the inorganic composition according to the above-described eighteenth aspect in which the mass ratio of $Li_2O/K_2O$ is 5.5 or more in the aforementioned component.

Comparing with a borate inorganic composition and phosphate inorganic composition in general, a silicate inorganic composition thought to easily crystallize is extremely difficult to melt at a low cost because of the high melting point of $SiO_2$. In order to solve this problem and produce an inorganic composition at a low cost within the range of formation of an inorganic composition of this type, it is necessary to dope an alkaline component to $SiO_2$ to a certain extent. However, since other components also play important roles respectively, it becomes possible to improve productivity while maintaining characteristic of crystallized glass by adjusting the mass ratio $Li_2O/K_2O$ preferably to 5.5 or more, more preferably 9.0 or more, and most preferably 9.5 or more within this composition range.

A twentieth aspect of the invention is the inorganic composition according to any one of the above-described first to eighteenth aspects which is a crystallized glass.

A twenty-first aspect of the invention is the inorganic composition according to any one of the above-described first to nineteenth aspects which is obtained by subjecting the original glass to a nucleus formation process at 450° C. to 620° C., followed by a heat treatment as a nucleus growth process at 620° C. to 800° C.

In the inorganic composition according to the present invention, the above-described composition is melted, shaped, and annealed, further followed by a heat treatment for a crystalline phase separation. In this heat treatment, the nucleus is formed at 450° C. to 620° C., and subsequently crystals grow at 620° C. to 800° C., so that a crystalline phase to be separated mainly comprises lithium monosilicate and lithium disilicate. In addition, temperatures for a nucleus formation and crystalline growth are relatively low, so that crystal separation is moderate, resulting in a uniform formation of crystals having minute particle diameter. Furthermore, since productivity of the inorganic composition of the present invention is high, and the temperature for its heat treatment is relatively low, it can be manufactured at low cost so as to be economical.

A twenty-second aspect of the invention is the inorganic composition according to the above-described first or second aspects which is a glass ceramics substrate for use in a medium for information recording.

A twenty-third aspect of the invention is an information recording medium using the glass ceramics substrate for use in an information recording medium according to the above-described twenty-second aspect.

A twenty-fourth aspect of the invention is the inorganic composition according to the above-described first or second aspects which is an electronic circuit substrate.

A twenty-fifth aspect of the invention is an electronic circuit using the electronic circuit substrate according to the above-described twenty-fourth aspect.

A twenty-sixth aspect of the invention is the inorganic composition according to the above-described first or second aspects which is a substrate for use in an optical filter.

A twenty-seventh aspect of the invention is an optical filter comprising forming a dielectric multilayer film on the substrate for use in the optical filter substrate according to the above-described twenty-sixth aspect.

A twenty-eighth aspect of the invention is a method for using the inorganic composition according to the above-described first or second aspects as a substrate for use in manufacturing a magnetic disc.

Particle diameters of crystalline particles of α-quartz (α-$SiO_2$), lithium disilicate ($Li_2Si_2O_5$), and lithium monosilicate ($Li_2SiO_3$) are extremely minute, and as a result, a substrate comprising an inorganic composition formed containing these crystalline particles has an extremely excellent surface roughness and excellent mechanical strength as well as a thermal expansion property suitable with each drive component so as to be useful as a substrate for use in manufacturing a magnetic disc.

An inorganic composition according to the present invention comprises at least one crystalline phase selected from the group consisting of (those of) lithium monosilicate ($Li_2SiO_3$), lithium disilicate ($Li_2SiO_2O_5$), and α-quartz (α-$SiO_2$), or at least a crystalline phase of lithium monosilicate ($Li_2SiO_3$), in which the particle diameter of those crystals is as minute as 1 μm or less, preferably 100 nm or less, more preferably 50 nm or less, and most preferably from 1 to 50 nm, and a particle content showing a crystalline phase is from 1 to 35% by mass, so that a surface roughness desirable for a substrate such as a disc substrate used as a magnetic recording medium can be obtained only by polishing, with no requirement of texture treatment; and a ring flexural strength can be remarkably improved, and as a result, the inorganic composition of this invention has a high degree of mechanical strength with durability to high speed rotation. In addition, the inorganic composition of this invention can suppress the deterioration of a substrate surface roughness after a surface etching treatment with acid, alkali or hydrofluoric acid as much as possible so as to be capable of providing a preferable substrate for an information recording medium, electronic circuit, optical filter, etc.

DETAILED DESCRIPTION OF THE INVENTION

Figure 1:
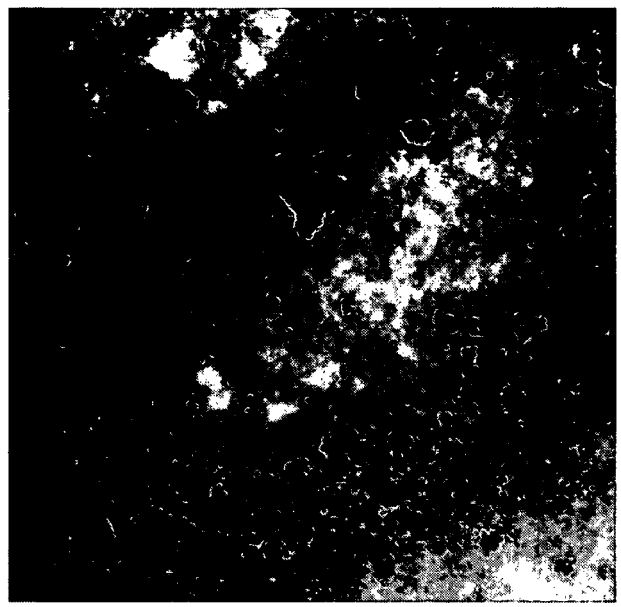
FIG. 1 depicts an electron micrograph (EM) of a crystallized glass of Example 1.

Next, the inorganic composition according to the present invention will be described with reference to specific embodiments.

The inorganic composition according to the present invention contains at least one crystalline phase selected from the group consisting of lithium monosilicate ($Li_2SiO_3$), lithium disilicate ($Li_2Si_2O_5$) or α-quartz (α-$SiO_2$) or at least a crystalline phase of lithium monosilicate ($Li_2SiO_3$), comprising crystalline phases in which minute crystals showing these crystalline phases whose mean particle diameter being 1 μm or less, preferably 100 nm or less, more preferably 50 nm or less, and most preferably from 1 to 50 nm are uniformly separated.

This inorganic composition is used, for example, in a disc substrate and such for use in a magnetic recording medium, and has the above-described properties, such that the inorganic composition is to have: a flat and smooth surface having a surface roughness (Ra) of which is 10 Å or less, preferably 5 Å or less, more preferably 3 Å or less, and most preferably 2 Å or less; a high mechanical strength in which a ring flexural strength is 300 MPa or more, preferably 450 MPa or more, more preferably 500 MPa or more, further more preferably 750 MPa or more, and most preferably 750 MPa or more and 1600 MPa or less; and a thermal expansion coefficient in a temperature range from 25 to 100° C. which is, at the minimum, +50 ($\times 10^{-7 \cdot °}C.^{-1}$) or more and at the maximum, +120 ($\times 10^{-7 \cdot °}C.^{-1}$) or less, and preferably +100 ($\times 10^{-7 \cdot °}C.^{-1}$) or less. Furthermore, Young's modulus of the inorganic composition is 80 GPa or more, and the specific gravity thereof is 2.7 or less.

This substrate is subjected, after polishing, to a washing treatment with acid or alkali to remove glass rubbish and abrasives adhering to the substrate surface. In the case of a crystallized glass in particular, because of the coexistence of crystals and a glassy component in a glass matrix, a surface roughness tends to deteriorate due to a difference in etching grade between the crystal and glassy component when a washing treatment with acid, alkali or hydrofluoric acid is performed. Therefore, in the present invention, it is possible to decrease a deterioration of surface roughness due to the washing treatment to, at the maximum, 2.0 Å or less, more preferably 1.5 Å or less, and further more preferably 1.0 Å or less by reducing the diameter of the contained particles showing a crystalline phase as much as possible and decreasing the existence ratio of particles showing the crystalline phase.

In an etching test, hydrofluoric acid (HF) was used. A polished substrate was immersed in a solution containing HF (0.48% by mass) for 1 minute, and subsequently washed to confirm a surface roughness of the substrate with an atomic force microscope (AFM).

Therefore, the inorganic composition of the present invention can be obtained by melting a composition comprising the following components as the formed oxide in terms of % by mass:

$SiO_2$: 50 to 90%, preferably 70 to 82%; $LiO_2$: 5 to 15%, preferably 7 to 13%; $Al_2O_3$: 0 to 20%, preferably 3 to 10%; MgO: 0 to 3%; ZnO: 0 to 3%; $P_2O_5$: 0 to 3%; $ZrO_2$: 0 to 3%; $K_2O$: 0 to 2%; and $Sb_2O_3+As_2O_3$: 0 to 2%; shaping, and annealing, followed by a heat treatment to crystallize the components. Thus crystalline phases of lithium monosilicate, lithium disilicate and α-quartz are selectively formed.

Hereinafter, a reason why a particle diameter, surface property, physical property and a composition of particles showing a crystalline phase of the inorganic composition according to the present invention are restricted as described above will be described.

First, regarding a crystalline phase, in order to obtain a desired surface roughness, the crystalline phase preferably contains lithium monosilicate ($Li_2SiO_3$), lithium disilicate ($Li_2Si_2O_5$) or α-quartz (α-$SiO_2$) whose separation ratio is relatively large and whose crystalline phase is in minute spherical particle form, more preferably contains lithium monosilicate, and most preferably lithium monosilicate ($Li_2SiO_3$), lithium disilicate ($Li_2Si_2O_5$) and α-quartz (α-$SiO_2$) These crystalline phases are separated in a relatively low temperature range to form minute crystalline particles, and a composition with an excellent surface roughness and physical property is easily obtained. In this case, in a relatively low temperature range of the crystallization temperature range in which crystalline phases of the above-described lithium monosilicate ($Li_2SiO_3$) and lithium disilicate ($Li_2Si_2O_5$) coexist, the crystalline particle diameter is extremely minute, so that a much more superior surface roughness can be obtained. Also, since the separation of α-quartz (α-$SiO_2$) with large particle diameter is limited to a low level, the surface smoothness becomes superior. However, since an ultra-smooth surface increases the stiction force between a head and medium to cause damage to a medium, a moderately smooth surface becomes necessary instead of an ultra-smooth surface, so that a technique to obtain a desired smooth surface by appropriately separating α-quartz (α-$SiO_2$) has been established in the present application.

In order to realize a reduction in surface roughness after polishing and excellent mechanical strength as described below, the existence ratio of particles showing a crystalline phase is to be, in terms of % by mass, at the minimum, 1%, more preferably 3%, and most preferably 5%, and, at the maximum, 44%, more preferably 30%, and most preferably 25%.

Next, regarding a surface property, as described above, along with an improvement in longitudinal recording density of an information recording medium, a floating height of a head has become recently 15 nm or less, from now on advancing from 15 nm or less in height towards a near contact recording system or a complete contact recording system. In order to correspond with such a tendency, smoothness of a substrate such as a disc substrate must be superior to a product currently in use.

Even though a high density input/output is attempted to perform to a magnetic recording medium with a conventional level of smoothness, input/output of magnetic signal cannot be achieved because of a large distance between a head and medium. Furthermore, attempting to reduce this distance causes a collision of projections on a medium (disc substrate) with a head, resulting in a head damage and medium damage. Accordingly, in order to avoid a head damage and disc substrate damage as well as adhesion of a head to a medium even in such an extremely low floating height or in a contact state, the surface roughness Ra (an arithmetic mean roughness) for a current magnetic recording medium is, at the maximum, preferably 10 Å or less, more preferably 5 Å or less, and most preferably 4 Å or less, and that for a future magnetic recording medium is, at the maximum, preferably 7 Å or less, more preferably 3 Å or less, and most preferably 2 Å or less, and is, at the minimum, 0.5 Å or more to meet a requirement for its smoothness. In order to obtain such a flat and smooth polished surface and a desired ring flexural strength, a mean particle diameter of particles showing a crystalline phase in an inorganic composition in the current magnetic recording medium is, at the maximum, preferably 1 μm or less, more preferably 100 nm or less, and most preferably 50 nm or less, while that in a future magnetic recording medium is, at the maximum, preferably 70 nm or less, and most preferably 40 nm or less, and at the minimum, preferably 1 nm or more because of the aforementioned reasons.

Furthermore, a mechanical strength of an inorganic composition can be improved by a uniform separation of minute crystalline particles. In particular, the separated crystalline particles prevent growth of minute cracks so as to enable the significant reduction of minute cracks caused by chipping at the time of polishing processing. Also from such a viewpoint, a mean particle diameter of the separated particles showing a crystalline phase is, as described above, at the maximum, preferably 1 μm or less, more preferably 100 nm or less, further more preferably 50 nm or less, and at the minimum, preferably 1 nm or more.

In order realize the aforementioned reduction of surface roughness and excellent mechanical property after polishing, an existence ratio of these particles showing a crystalline phase is in a range of, at the minimum, 1% or more, preferably 3% or more, and most preferably 5% or more, and at the maximum, 44% or less, preferably 34% or less, and most preferably 33% or less.

After polishing the substrate, a washing treatment with acid or alkali is performed to remove glass rubbish and abrasive adhering to the substrate surface. In the case of the crystallized glass in particular, because of coexistence of crystals and a glassy component in a glass matrix, a surface roughness tends to deteriorate due to a difference in etching grade between crystals and a glassy component when a washing treatment with acid and alkali is performed. Therefore, in the present invention, a deterioration of surface roughness due to a washing treatment is successfully reduced to 2.0 Å or less by decreasing the diameter of contained particles showing a crystalline phase in the extreme and lowering the existence ratio of particles showing a crystalline phase. The deterioration of surface roughness is reduced, at the maximum, more preferably to 1.5 Å or less, and still more preferably to 1.0 Å or less.

When a surface roughness (Ra) after polishing is termed Ra1, and that by acid washing or alkali washing after polishing processing is termed Ra2, a value of the rate of change in surface roughness (|Ra2−Ra1|/Ra1) is preferably less than 0.62.

Next, the ring flexural strength and specific gravity of a substrate will be described. As described above, in order to improve a recording density and data transmission speed, the tendency of high speed rotation of information recording medium disc substrate is in progress. In order to correspond with this tendency, a substrate material must have a high rigidity and a low specific gravity so as to prevent a disc vibration due to the deflection during a high speed rotation. And, when a substrate material is used in a portable recording device such as a head contact and a removable recording apparatus, it becomes necessary for the substrate material to have a mechanical strength, a high Young's modulus, and a surface hardness capable of sufficiently standing such a usage; specifically a flexural strength being preferably 300 MPa or more, and Young's modulus being preferably 80 GPa or more.

Therefore, regarding a mechanical strength also from this viewpoint, the ring flexural strength is, at the minimum, 300 MPa or more, preferably 450 MPa or more, more preferably 500 MPa or more, still more preferably 750 MPa or more, and most preferably 750 MPa or more and 1600 MPa or less. Young's modulus is 80 GPa or more.

However, when rigidity is high but specific gravity is large, the substrate material causes a deflection due to a large weight thereof during a high speed rotation to generate vibration. On the contrary, when specific gravity is small but rigidity is low, it similarly generates a vibration. On the other hand, when specific gravity is made too low, it becomes difficult to obtain a desired mechanical strength for the substrate material. Therefore, it becomes necessary to keep a balance between seemingly conflicting properties in a disc substrate, that is, high rigidity versus low specific gravity. In a preferable range of the balance, a ratio of Young's modulus (GPa)/specific gravity is 30 or more; in a more preferable range thereof, the ratio is 33 or more, and in the most preferable range, the ratio is 35 or more. Regarding specific gravity, it must be 2.7 or less even with a high rigidity, but when it is below 2.2, it becomes substantially difficult to obtain a substrate material with a desired rigidity from an inorganic composition of this type.

Regarding thermal expansion coefficient, along with an improvement in recording density, a high precision is required in positioning a magnetic head and a medium, so that a high dimensional accuracy is demanded for each component of the medium substrate and disc. Consequently, the effect of differences in thermal expansion coefficient among these components becomes not negligible, so that differences in these thermal expansion coefficients must be made as little as possible. As a component used in a small-sized magnetic information recording medium in particular, the one having the thermal expansion coefficient in a range from +90 to +100 ($\times 10^{-7 \cdot \circ}$ C.$^{-1}$) is widely used, and it is thought that the thermal expansion coefficient in this range is also required for the substrate. However, some drive makers may use materials having thermal expansion coefficient beside this range (from about +70 to about +125 ($\times 10^{-7 \cdot \circ}$ C.$^{-1}$) for the component.

From the above-described reasons, in order to be capable of corresponding with a wide variety of material properties of components to be used while keeping balance with strength in a crystalline phase of an inorganic composition of the present invention, the thermal expansion coefficient in a range from 25 to 100° C., at the maximum, is preferably +50 ($\times 10^{-7 \circ}$ C.$^{-1}$) or more, and at the minimum, preferably +120 ($\times 10^{-7 \cdot \circ}$ C.$^{-1}$) or less, and more preferably +100 ($\times 10^{-7 \cdot \circ}$ C.$^{-1}$) or less.

Next, the reason why a composition range of the inorganic composition has been restricted as described above will be explained. In this case, the content of each component of the inorganic composition is expressed in terms of % by mass. Furthermore, in the present patent application, contents of components in the inorganic composition expressed in terms of % by mass are all the contents of the formed oxides derived from each component expressed in terms of % by mass.

The inorganic composition according to the present invention is prepared, for example, by melting, shaping, and annealing the above-described composition followed by a heat treatment, and the $SiO_2$ component is an extremely important component to produce crystals of lithium monosilicate ($Li_2SiO_3$), lithium disilicate ($Li_2Si_2O_5$), and α-quartz (α-$SiO_2$) separated as a crystalline phase by the heat treatment.

However, when the content thereof is 50% or less, the separated crystals of the obtained inorganic composition are unstable and apt to coarsen the crystalline structure, while when the content exceeds 90%, it is apt to become difficult to melt and shape an inorganic composition prior to the heat treatment (referred to as an original inorganic composition). Therefore, the content range thereof is from, at the minimum, preferably 50%, more preferably 65%, and most preferably 70%, and to, at the maximum, preferably 90%, more preferably 85%, and most preferably 82%.

The $Li_2O$ component is an extremely important component to produce lithium monosilicate ($Li_2SiO_3$) and lithium disilicate ($Li_2Si_2O_5$) which are separated as a crystalline phase by heat treatment of the original inorganic composition. However, when the content thereof is less than 5%, the above-described separation of crystals and the melting of the original inorganic composition are both apt to become difficult, and when the content exceeds 15%, the obtained crystals are unstable so as to not only readily coarsen the crystalline structure but also readily reduce the chemical resistance. Therefore, the range of content thereof is, at the minimum, from preferably 5%, more preferably 6%, and most preferably 7%, and at the maximum, to preferably 15%, more preferably 14%, and most preferably 13%.

The $Al_2O_3$ component is preferable to improve a chemical resistance and mechanical hardness of the inorganic composition. Though the type of separated crystals becomes different depending on the heat treatment conditions, even though taking various heat treatment conditions into consideration, in order to separate lithium monosilicate ($Li_2SiO_3$) and lithium disilicate ($Li_2Si_2O_5$), the $Al_2O_3$ component is contained in an amount ranging from, at the maximum, preferably 20%, more preferably 15%, and most preferably 10%, and to, at the minimum, preferably 1%, more preferably 2%, and most preferably 3%.

The MgO and ZnO components are those to not only improve the melting property of the inorganic composition but also prevent the coarsening of the separated crystals, and furthermore, they are effective in separating crystalline particles of lithium monosilicate ($Li_2SiO_3$) and lithium disilicate ($Li_2Si_2O_5$) in spherical form as a crystalline phase. However, when they are contained in excess, the obtained crystals are unstable and the crystalline structure is apt to become coarse, so that the MgO component is contained preferably in an amount of 3% or less, more preferably in an amount of 2% or less, and most preferably in an amount of 1% or less. Furthermore, the ZnO component is contained in an amount of preferably 3% or less, more preferably 2% or less, and most preferably 1% or less.

The $P_2O_5$ component in the present invention is a useful component acting as a crystalline nucleus forming agent for the inorganic composition. However, when the $P_2O_5$ component is contained in an amount exceeding 3%, an opalescent devitrification of the original inorganic composition occurs, so that it is preferably contained in an amount of 3% or less. Furthermore, when the $P_2O_5$ component is contained in an amount of less than 1%, the crystalline nucleus formation may become insufficient resulting in an abnormal growth of the separated crystalline phase sometimes, such that it is preferably contained in an amount ranging from, at the maximum, 3% to, at the minimum, 1%.

The $ZrO_2$ component is a useful component not only functioning as a crystalline nucleus forming agent for the inorganic composition similarly as the $P_2O_5$ component but also having a remarkable effect in miniaturizing the separated crystalline particles and improving a mechanical strength as well as a chemical resistance of the material. However, when it is contained in an amount exceeding 3%, the original inorganic composition is apt to become difficult to melt, so that it is contained in an amount of forcibly 3% or less, more preferably 2.7% or less, and most preferably 2.5% or less.

The $K_2O$ component is a component not only improving a melting property of the inorganic composition but also preventing coarsening of the separated crystals. It is contained in an amount of 2% or less, more preferably 1.7% or less, and most preferably 1.5% or less.

The $Sb_2O_3$ component and $As_2O_3$ component are added as a clarificant at the time of melting the inorganic composition, the sum of those components being in an amount of 2% or less, more preferably 1.5% or less, and most preferably 1% or less.

In this case, the $Na_2O$ component is a component which is apt to pose problems in preparing a magnetic film of high precision and miniaturizing the same. When this component is present in a substrate, the Na ion diffuses into a magnetic film during the film formation to cause an abnormal growth of the magnetic film particles and a reduction of their orientations so as to be apt to deteriorate the magnetic property. Furthermore, the Na ion gradually diffuses into the magnetic film likely to deteriorate a long-term stability of the magnetic property such that the $Na_2O$ component is preferably not contained. Furthermore, the PbO component is environmentally an unfavorable component so that the use thereof is preferably avoided as much as possible.

A component comprising metallic oxides of V, Cu, Mn, Cr, Co, Mo, Ni, Fe, Te, Ce, Pr, Nd and Er is likely to color a glass and deteriorate other properties thereof so that it is preferably not substantially contained.

Next, in order to prepare the inorganic composition according to the present invention, after a material having the above-described composition is first melted, and subjected to a hot shaping or a cold processing, the material is heat-treated at a temperature ranging from, at the minimum, 450° C. or more, preferably 480° C. or more, and more preferably 520° C. or more, to, at the maximum, 620° C., preferably 580° C., and more preferably 560° C. for about 1 to 20 hours to form a crystalline nucleus, followed by a heat treatment at a temperature ranging from, at the minimum, 620° C. or more to, at the maximum, 800° C., preferably 750° C., and more preferably 685° C. for about 0.5 to 10 hours to perform a crystallization. Furthermore, in order to realize a further smoothness of a substrate so as to correspond with a tendency of a high density recording in the future, a nucleus forming temperature is, at the maximum, preferably 700° C., more preferably 680° C., and most preferably 670° C.

In this case, when a crystalline nucleus forming temperature becomes 450° C. or less, a nucleus is not formed so that crystallization is not initiated, while when the temperature becomes 620° C. or more, not only a nucleus formation but also a crystalline growth simultaneously occur, so that the crystallization becomes uncontrollable. In addition, when a crystallization temperature is lowered to 620° C. or less, even a crystal having a preferable thermal expansion coefficient hardly grows, and when the crystallization temperature is raised to 800° C. or more, a crystal having a low expansion property is forced to be separated.

A crystalline phase of the thus crystallized inorganic composition by a heat treatment comprises lithium monosilicate ($Li_2SiO_3$), lithium disilicate ($Li_2Si_2O_5$) and α-quartz (α-$SiO_2$) including at least lithium monosilicate ($Li_2SiO_3$), in which a mean particle diameter of crystals is 1 μm or less, more preferably 100 nm or less, and still more preferably 50 nm or less, and minute crystals are uniformly separated, so that a crystallized glass superb in surface roughness and mechanical strength applicable to a disc substrate for a magnetic information recording can be obtained.

In this case, the higher the crystallization temperature becomes, the more the separation of α-quartz increases. Since the difference in the thermal expansion coefficient between α-quartz and the original inorganic composition is large, when the existence ratio of α-quartz becomes too high, a mechanical strength of the crystallized inorganic composition is reduced. On the contrary, when the crystallization temperature is too low, lithium monosilicate ($Li_2SiO_3$) is separated in a great correspond, posing problems such as a deterioration of surface roughness and a reduction of the mechanical strength due to an increase in particle diameter. In the present application, in order to obtain an inorganic composition such as a crystallized glass superb in a surface roughness and mechanical strength, the highest Powder X-ray diffraction (XRD) peak intensity in each crystal preferably satisfies the following equation 1, in which $I_{Li2Si2O5}$ is the XRD peak intensity of lithium disilicate, $I_{Li2SiO3}$ is that of lithium monosilicate, and $I_s$ is a sum of those of other coexisting crystalline phases.

Equation 1

$$I_{Li2Si2O5}/(I_{Li2Si2O5}+I_{Li2SiO3}) \geq 0.2$$

$$(I_{Li2Si2O5}+I_{Li2SiO3})/(I_{Li2Si2O5}+I_{Li2SiO3}+I_s) \geq 0.2 \quad \text{Equation 1}$$

Next, by lapping this substrate comprising an inorganic composition crystallized by a heat treatment according to a standard method followed by polishing the same, a material for a disc substrate, an electronic circuit substrate, and an optical disc substrate the surface roughness (Ra) (an arithmetic mean roughness) of which is 10 Å or less, more preferably 5 Å or less, still more preferably 3 Å or less, and most preferably 2 Å or less is obtained. And, by forming, on this disc substrate material, a magnetic film, and, as the occasion may demand, Ni—P plating, or a foundation layer, a protective layer, a lubricating film, and such, a magnetic information recording medium disc capable of corresponding with a high density recording can be obtained. An optical disc is also obtained by forming a dielectric multilayer film on the optical disc substrate material.

EXAMPLES

Herein after, the present invention will be explained in more detail with reference to embodiments; however, they should not be construed as limiting the invention in any way. Examples 1 to 3 and Comparative Examples 1 to 4

Table 1 shows, regarding a crystallized glass which is an inorganic composition according to the present invention as described in Examples 1 to 3; three kinds of glass ceramics of a conventional $Li_2SiO_3$ type (as described in Comparative Example 1: Japanese Unexamined Patent Application, Publication No. Sho 62-72547, Comparative Example 2: Japanese Unexamined Patent Application, Publication No. Hei 06-329440, and Comparative Example 3: Japanese Unexamined Patent Application, Publication No. Hei 07-169048); and an amorphous glass of a conventional $Li_2O$—$SiO_2$ type as described in Comparative Example 4, a ratio of component composition, a nucleus formation temperature of a crystallized glass, a crystallization temperature, a crystalline phase, a crystallinity degree, a mean crystalline particle diameter, a ring flexural strength, a surface roughness Ra (an arithmetic mean roughness) obtained by polishing, an amount and a ratio of change in surface roughness by a hydrofluoric acid washing after polishing, a specific gravity, and values of Young's modulus, and thermal expansion coefficient. Herein, specific gravity is measured by the Archimedes' method, Young's modulus by an ultrasonic method, and thermal expansion coefficient by an optical interferometry.

The glass ceramics according to Examples 1 to 3 and those according to Comparative Examples 1 to 3 are all obtained as a glass compact by mixing a raw material such as oxide, carbonate, and nitrate in a ratio shown in Table 1, melting the mixture using an ordinary melting apparatus at temperatures from about 1200 to 1550° C., stirring the melted material to homogeneity, forming it to a disc shape, and cooling it. Subsequently, this glass compact was crystallized by heat-treatment under the nucleus formation condition and crystallization condition to obtain a desired crystallized glass. Then this crystallized glass was lapped with 800# to 2000# diamond pellet for about 1 to 20 minutes and then polished for finishing with an abrasive (cerium oxide) having a mean particle diameter of 3 μm or less for about 10 to 120 minutes. Furthermore, an amorphous glass according to Comparative Example 4 was obtained as a glass compact by mixing a raw material such as oxide, carbonate, and nitrate in a ratio shown in Table 1, melting the resulting mixture using an ordinary melting apparatus at a temperature ranging from about 1200 to 1550° C., stirring the mixture to homogeneity, shaping it to a disc, and cooling the same.

A mean particle diameter of particles showing a crystalline phase of each crystallized glass thus obtained was determined with a transmission electron microscope (TEM). In addition, a crystalline type of each crystalline particle was identified by an XRD analysis.

Furthermore, a surface roughness Ra (an arithmetic mean roughness) was obtained with an atomic force microscope (AFM).

In an etching test to measure a change in surface roughness (Ra) was used hydrofluoric acid (HF), and a polished substrate was immersed in a solution containing HF (0.48% by mass) for 1 minute. Subsequently the substrate was washed to confirm a surface roughness (Ra) thereof with an atomic force microscope (AFM). A surface roughness, and an amount as well as a rate of change in the surface roughness of an oxide crystal after the hydrofluoric acid treatment (HF treatment) are shown in Table 1.

A ring flexural strength was calculated by preparing a thin disc-shaped sample of about 65 mm in diameter and about 0.6 mm in thickness, obtaining a breaking load by a concentric ring flexural method for measuring a longitudinal strength of a disc-shaped sample using a support ring and a load ring, and using the following equation 2 from an inside diameter, an outside diameter, a disc thickness, a Poisson's ratio, and a breaking load.

Equation 2

$$\sigma_\theta = \frac{3P}{4\pi h^2}\left[2(1+v)\left(A+\ln\frac{a}{b}\right)+(1-v)\left(1-B\frac{a^2}{b^2}\right)\right] \quad \text{(Equation 2)}$$

$$A = \frac{1-v}{2(1+v)} + \frac{b^2}{a^2-b^2}\ln\frac{a}{b}$$

$$B = -\frac{2(1+v)}{1-v}\frac{b}{a^2-b^2}\ln\frac{a}{b},$$

wherein P denotes a breaking load, "a" a disc outside diameter, b a disc inside diameter, h a disc thickness, and v a Poisson's ratio.

A separated crystalline phase and a crystallinity degree (existence ratio of particle showing a crystalline phase) were identified with an X-ray diffractometer (Phillips, trade name: X' Pert-MPD) and an energy dispersive analyzer (Hitachi, trade name: S-4000N; Horiba, trade name: EX420).

TABLE 1

| | | Example | | | Comparative example No | | | |
|---|---|---|---|---|---|---|---|---|
| | | 1 | 2 | 3 | 1 | 2 | 3 | 4 |
| $SiO_2$ | | 76 | 76 | 76 | 74.2 | 76.1 | 75.3 | 76 |
| $Li_2O$ | | 10 | 10 | 10 | 9.6 | 11.6 | 9.6 | 10 |
| $Al_2O_3$ | | 7.2 | 7.2 | 7.2 | 9.6 | 7.1 | 7 | 7.2 |
| MgO | | 0.8 | 0.8 | 0.8 | — | — | 0.8 | 0.8 |
| ZnO | | 0.5 | 0.5 | 0.5 | — | — | 0.5 | 0.5 |
| $P_2O_3$ | | 2 | 2 | 2 | 1.5 | 2 | 2. | 2 |
| $ZrO_2$ | | 2.3 | 2.3 | 2.3 | 0.4 | — | 2.3 | 2.3 |
| $K_2O$ | | 1 | 1 | 1 | 2.4 | 2.8 | 2 | 1 |
| $Sb_2O_3$ | | 0.2 | 0.2 | 0.2 | — | 0.2 | 0.2 | 0.2 |
| Others (PbO) | | — | — | — | 2.3 | — | — | — |
| $Li_2O/K_2O$ | | 7.2 | 7.2 | 7.2 | 4 | 4.1 | 4.8 | 10 |
| Nucleus formation temperature (° C.) | | 540° C. | 540° C. | 540° C. | 540° C. | 500° C. | 540° C. | Untreated |
| Retention time (hr) | | 5 | 5 | 5 | 3 | 3 | 5 | — |
| Crystallization temperature (° C.) | | 620° C. | 640° C. | 660° C. | 800° C. | 850° C. | 750° C. | Untreated |
| Retention time (hr) | | 3 | 3 | 3 | 2 | 3 | 3 | — |
| Crystal-line phase | Crystal | Lithium monosilicate | Lithium monosilicate | Lithium monosilicate | — | — | Lithium monosilicate | — |
| | Crystallinity degree | 5 | 7 | 0 | | | 0 | |
| | Crystal | Lithium disilicate | Lithium disilicate | Lithium disilicate | Lithium disilicate | Lithium disilicate | Lithium disilicate | — |
| | Crystallinity degree | 1 | 2 | 28.8 | 45 | 48 | 29 | |
| | Crystal | α-Quartz | α-Quartz | α-Quartz | α-Cristobalite | β-Spodumene | α-Quartz | — |
| | Crystallinity degree | 0.3 | 0.5 | 3.4 | 16 | 21 | 15.6 | |
| | Total crystallinity degree | 6.3 | 9.5 | 32.2 | 61 | 69 | 44.6 | — |
| Mean crystalline particle diameter (nm) | | 10 | 20 | 30 | 1200 | 130 | 100 | — |
| Ring flexural strength (MPa) | | 1331 | 1535 | 1252 | 320 | 300 | 748 | 280 |
| Surface roughness Ra (Å) | | 1.86 | 1.94 | — | 12 | 11 | 5.28 | — |

TABLE 1-continued

| | | Example | | | Comparative example | | | |
|---|---|---|---|---|---|---|---|---|
| | | \multicolumn{7}{c}{No} | | | | | | |
| | | 1 | 2 | 3 | 1 | 2 | 3 | 4 |
| Ra change due to HF washing | Before washing (Ra1) | 1.86 | 1.94 | — | 12 | 11 | 5.28 | — |
| | After washing (Ra2) | 2.5 | 3 | — | 19.4 | 25 | 19.45 | — |
| | Difference (|Ra2 − Ra1|) | 0.64 | 1.06 | — | 7.4 | 14 | 14.17 | — |
| | Rate of Change in surface roughness (|Ra2 − Ra1|/Ra1) | 0.34 | 0.55 | — | 0.62 | 1.27 | 2.68 | — |
| Specific gravity | | 2.41 | 2.43 | — | 2.46 | 2.55 | 2.47 | — |
| Young's modulus (GPa) | | 92 | 94 | — | 86 | 82 | 98 | — |
| Specific gravity/ | | 38.2 | 38.7 | — | 35 | 32.2 | 39.7 | — |
| Thermal expansion coefficient ($\times 10^{-7} \cdot °C.^{-1}$) ((−25 to −100° C.)) | | 63 | 65 | — | 48 ((−50~+70° C. | 49 ((−50~+70° C. | 74 ((−50~+70° C. | — |

Figure 2:
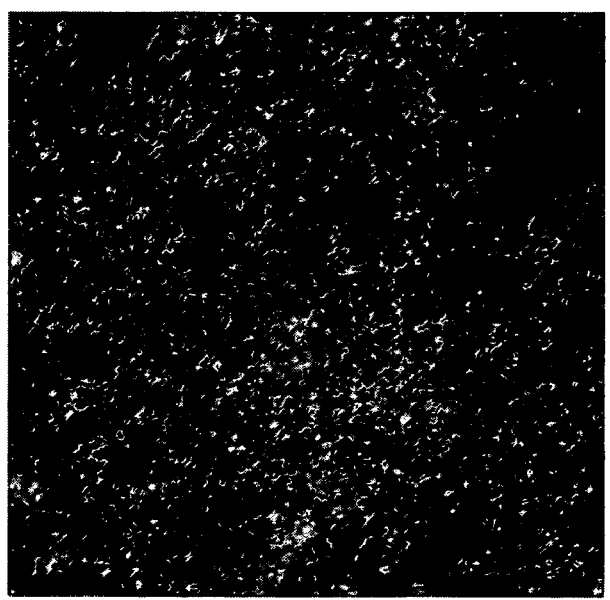
FIG. 2 depicts a transmission electron micrograph (TEM) of a crystallized glass of Example 2.

TEM photographs of crystals in particle shape of Examples 1 and 2 are shown in FIGS. 1 and 2, in which all of the crystalline particles are minute and approximately spherical with a mean crystalline particle diameter being 10 nm and 20 nm.

As shown in Table 1, when Examples 1 and 2 of the present invention and Comparative Examples of a crystallized glass of a conventional $Li_2SiO_3$ type are compared, a mean particle diameter and a crystallinity degree of particles showing a crystalline phase are different; in a crystallized glass of the present invention, the crystalline phase thereof comprises lithium monosilicate ($Li_2SiO_3$) and lithium disilicate ($Li_2Si_2O_5$) whose mean crystalline particle diameter is 0.02 μm or less, and all crystals are minute and in approximately spherical form, while in the crystallized glass according to Comparative Example 1, a mean crystalline particle diameter of lithium disilicate is 1.5 μm and that of α-cristobalite is 0.3 μm; in the crystallized glass according to Comparative Example 2, a mean crystalline particle diameter of lithium disilicate is 0.1 μm and that of β-spodumene is 0.2 μm; and in a crystallized glass according to Comparative Example 3, a mean crystalline particle diameters of lithium disilicate and α-quartz are 0.15 μm such that they are all in a relatively large needle form or rice grain spherical form. In a situation in which a more superb surface smoothness is demanded, such a crystallized glass will affect a surface roughness obtained by polishing and defect so that glass ceramics according to Comparative Examples 1 and 2 have a surface roughness Ra (an arithmetic mean roughness) of 10 Å or more, indicating a difficulty to obtain a surface property excellent in smoothness. Furthermore, the crystallized glass according to Comparative Examples 1 and 2 has a ring flexural strength of 320 MPa or less and a Young's modulus of 86 GPa or less so as to be a material of a low rigidity and low Young's modulus. And, a surface roughness of a glass according to Comparative Example 3 is 5.28 Å, showing a lower value than those of Comparative Examples 1 and 2. On the other hand, an amount of change in surface roughness after washing is 14 Å or more and a ratio of change in surface roughness is as high as 2.68, and the Young's flexural strength is less than 750 MPa.

Furthermore, in Example 3 of the present invention, the crystalline phase comprises lithium disilicate ($Li_2Si_2O_5$) and α-quartz (α-$SiO_2$), in which a mean crystalline particle diameter being 0.03 μm and a crystallinity degree about 33%, and crystals are minute and roughly spherical in shape, whereas although the crystalline phase of Comparative Example 3 also comprises lithium disilicate and α-quartz, in which a mean crystalline particle diameter is 0.1 μm and a crystallinity degree is about 45%, and crystals being from relatively large needles to rice grain-like spheres in shape. Such a crystalline phase will affect a ring flexural strength. The crystalline glass according to Comparative Example 3 has a ring flexural strength of less than 750 MPa so as to be a low strength material compared with those according to Examples 1 to 3. Furthermore, a glass in Comparative Example 4 is not subjected to a crystallization treatment so as to be a low strength material with a ring flexural strength of 280 MPa or less.

In addition, on the glass ceramics obtained in Examples described above, a Cr intermediary layer (80 nm), a Co—Cr magnetic layer (50 nm), and an SiC protective film (10 nm) were formed by the DC spattering method.

Subsequently, a lubricant of a perfluoro-polyether type is applied (5 nm in thickness) to the aforementioned crystallized glass with the layers and film to obtain a magnetic information recording medium.

The thus obtained magnetic information recording medium was capable of reducing a head floating height compared with that currently in use owing to an excellent surface roughness thereof, and also operating an input-output of magnetic signals causing neither head damage nor medium damage even when a signal input-output was performed while a head was in contact with a medium. Furthermore, the crystallized glass according to the present invention will show a stable bumpy shape also in a laser texture performed in a landing zone system.

An inorganic composition according to the present invention has an excellent thermal resistance and a mechanical strength required to be capable of corresponding with a high recording density by a magnetic recording system in the future, a high recording density by a perpendicular magnetic recording system in particular such that it can provide an inorganic composition to achieve an ultra-smooth surface which will become necessary for improving the crystalline orientation of a film material at the time of film formation. Thus, the inorganic composition of this invention is not only preferable for use in a perpendicular magnetic recording medium substrate for the HDD (hard drive/hard disk [disc] (drive)) system but also usable as an information recording medium substrate, an electric circuit substrate, a substrate for optical filter, and an optical filter with a dielectric multilayer formed on an optical filter substrate.

What is claimed is:

1. An inorganic composition containing a crystalline phase of lithium monosilicate ($Li_2SiO_3$), wherein a mean particle diameter of a particle thereof showing the crystalline phase is 100 nm or less.

2. The inorganic composition according to claim 1 further containing at least one kind of crystalline phase of lithium disilicate ($Li_2Si_2O_5$) and α-quartz (α-$SiO_2$).

3. The inorganic composition according to claim 1, wherein a mean particle diameter of a particle showing the crystalline phase is 50 nm or less.

4. The inorganic composition according to claim 1, wherein a mean particle diameter of a particle showing the crystalline phase is 1 nm or more and 50 nm or less.

5. The inorganic composition according to claim 1, wherein a particle content showing the crystalline phase is from 1 to 44% by mass.

6. The inorganic composition according to claim 1, wherein the ring flexural strength is 300 MPa or more.

7. The inorganic composition according to claim 1, wherein the ring flexural strength is 450 MPa or more.

8. The inorganic composition according to claim 1, wherein the ring flexural strength is 750 MPa or more and 1600 MPa or less.

9. The inorganic composition according to claim 1, wherein the surface roughness (Ra) is 10 Å or less.

10. The inorganic composition according to claim 1, wherein, when a surface roughness (Ra) after polishing is Ra1, and an acid washing or alkali washing after the polishing process is Ra2, the value of a ratio of change in surface roughness (|Ra2−Ra1|/Ra1) is less than 0.62.

11. The inorganic composition according to claim 1, wherein the surface roughness (Ra) after the polishing is 0.5 Å or more and 10 Å or less, and an amount of change in the surface roughness due to an acid washing or alkali washing after the polishing process is less than 2.0 Å.

12. The inorganic composition according to claim 1, wherein the surface roughness (Ra) after polishing is 0.5 Å or more and 10 Å or less, and an amount of change in the surface roughness due to a hydrofluoric acid washing after the polishing process is less than 2.0 Å.

13. The inorganic composition according to claim 1, wherein the inorganic composition contains the following components as the formed oxides in terms of % by mass:
$SiO_2$: 50 to 90%; $Li_2O$: 5 to 15%; $Al_2O_3$: 0 to 20%; MgO: 0 to 3%; ZnO: 0 to 3%; $P_2O_5$: 0 to 3%; $ZrO_2$: 0 to 3%; $K_2O$: 0 to 2%; and $Sb_2O_3$+$As_2O_3$: 0 to 2%.

14. The inorganic composition according to claim 13, wherein the mass ratio of $Li_2O/K_2O$ is 5.5 or more.

15. The inorganic composition according to claim 1, wherein the inorganic composition contains the following components as the formed oxides in terms of % by mass:
$SiO_2$: 70 to 82%; $Li_2O$: 7 to 13%; $Al_2O_3$: 3 to 10%; MgO: 0 to 3%; ZnO: 0 to 3%; $P_2O_5$: 1 to 3%; $ZrO_2$: 0 to 3%; $K_2O$: 0 to 2%; and $Sb_2O_3$+$As_2O_3$: 0 to 2%.

16. The inorganic composition according to claim 15, wherein the mass ratio of $Li_2O/K_2O$ is 5.5 or more.

17. The inorganic composition according to claim 1 which is a crystallized glass.

18. The inorganic composition according to claim 1 which is obtained by subjecting an original glass to a nucleus formation process at 450° C. to 620° C. followed by a nucleus growth process through heat treatment at 620° C. to 800° C.

19. The inorganic composition according to claim 1 which is a glass ceramics substrate for use in an information recording medium.

20. An information recording medium using the glass ceramic substrate for use in an information recording medium according to claim 19.

21. The inorganic composition according to claim 1 which is an electronic circuit substrate.

22. An electronic circuit used in the electronic circuit substrate according to claim 21.

23. The inorganic composition according to claim 1 which is a substrate for use in an optical filter.

24. An optical filter prepared by forming a dielectric multilayer film on the substrate for use in an optical filter according to claim 23.

25. The inorganic composition according to claim 1, wherein the surface roughness (Ra) after polishing is 0.5 Å or more and 2 Å or less.

26. The inorganic composition according to claim 1, wherein the content of $AL_2O_3$ oxide is 10% or less and the content of $P_2O_5$ is 3% or less in terms of % by mass.

27. The inorganic composition according to claim 1, wherein the inorganic composition does not substantially contain a component comprising metallic oxides of V, Cu, Mn, Cr, Mo, Ni and Fe.

28. The inorganic composition according to claim 1, wherein the inorganic composition is used as a substrate for a magnetic disk.

* * * * *